| United States Patent [19] | [11] Patent Number: 4,945,235 |
|---|---|
| Nishioka et al. | [45] Date of Patent: Jul. 31, 1990 |

[54] FINE ADJUSTMENT MECHANISM FOR A SCANNING TUNNELING MICROSCOPE

[75] Inventors: Tadashi Nishioka; Takao Yasue; Hiroshi Koyama, all of Itami, Japan

[73] Assignee: Mitsubishi Denki Kabushiki Kaisha, Japan

[21] Appl. No.: 233,741

[22] Filed: Aug. 19, 1988

[30] Foreign Application Priority Data

May 16, 1988 [JP] Japan .................................. 63-116927

[51] Int. Cl.⁵ .............................................. H01J 37/00
[52] U.S. Cl. .................................. 250/306; 250/423 F
[58] Field of Search .................. 250/306, 423 F, 442.1

[56] References Cited

U.S. PATENT DOCUMENTS 4,785,177 11/1988 Besocke ............................. 250/306

OTHER PUBLICATIONS

Binnig et al., "Single-Tube Three-Dimensional Scanner for Scanning Tunneling Microscopy", Rev. Sci. Instrum., vol. 57, pp. 1688-1689 (1986).

K. Besocke, "An Easily Operable Scanning Tunneling Microscrope", Surface Science, vol. 181, pp. 145-153 (1987).

*Primary Examiner*—Bruce C. Anderson
*Attorney, Agent, or Firm*—Leydig, Voit & Mayer

[57] ABSTRACT

A fine adjustment mechanism for a scanning tunneling microscope includes a mounting member, a cylindrical piezoelectric element fixed to the mounting member at one end of the element, a probe provided at the other end of the piezoelectric element, and electrodes disposed on the inner and outer walls of the piezoelectric element, one of the electrodes being divided into a plurality of electrode groups in the longitudinal direction of the piezoelectric element.

14 Claims, 3 Drawing Sheets

FINE ADJUSTMENT MECHANISM FOR A SCANNING TUNNELING MICROSCOPE

BACKGROUND OF THE INVENTION

1. Field of the Invention:

The present invention relates to a fine adjustment mechanism for a scanning tunneling microscope (hereinafter referred to as an STM), and, more particularly, to a three-dimensional fine adjustment mechanism which employs a cylindrical piezoelectric element.

2. Description of the Related Art:

Generally, STMs include a combination of a coarse adjustment mechanism and a fine adjustment mechanism, the coarse adjustment mechanism for holding a sample to be observed and the fine adjustment mechanism for retaining a probe. In such STMs, after the sample has been advanced by the coarse adjustment mechanism to the vicinity of the forward end of the probe, the probe is moved towards the sample by the fine adjustment mechanism while a voltage is being applied between the sample and the probe, until a tunneling current having a predetermined magnitude flows therebetween. Subsequently, the probe is moved along the surface of the sample by the fine adjustment mechanism, to detect the irregularities on the surface of the sample on an atomic scale utilizing variations in the tunnel current.

The fine adjustment mechanism for use in such STMs in general employs a cylindrical piezoelectric element, such fine adjustment mechanism being disclosed, for example, on pages 1688 and 1689 of Rev. Sci. Instrum., Vol. 57 (1986) by G. Binnig and D. P. E. Smith and on pages 145 to 153 of Surface Science, Vol. 181 (1987) by K. Besocke.

In any of these fine adjustment mechanisms, four electrodes are provided on the outer peripheral surface of a cylindrical piezoelectric element are separated from each other around the periphery of the cylinder, and an electrode is provided on the entire inner peripheral surface thereof. A probe is mounted on one end of the cylinder. The probe is moved in directions (X and Y directions) perpendicular to the axis of the cylinder by the application of voltages having opposite polarities to an opposing pair of the electrodes formed on the outer peripheral surface of the cylinder. Application of voltages between the electrode formed on the inner peripheral surface of the cylinder and the electrodes provided on the outer peripheral surface moves the probe in the axial direction (Z direction) of the cylinder.

It is known that scanning sensitivity, i.e., the rate at which the probe is displaced relative to the voltage applied to the electrode, of such a fine adjustment mechanism is determined by the piezoelectric distortion constant of the piezoelectric element and the dimensions of the piezoelectric element and the electrode. Therefore, a conventional fine adjustment mechanism has an inherent scanning sensitivity which is based on the structure thereof, and which cannot be freely changed.

As a result, a fine adjustment mechanism having a small scanning sensitivity is selectively employed when the surface of a sample in a small scanning area is observed in detail. Conversely, in order to observe the surface of the sample in a broad area, a fine adjustment mechanism having a large scanning sensitivity is selectively used. Thus, the choice of a conventional fine adjustment mechanism involves a problem in that a fine adjustment mechanism which suits a particular object of observation must be employed.

Further, if the waveform of a voltage applied to the electrode is varied, the probe of a fine adjustment mechanism having a fixed scanning sensitivity can be moved finely and coarsely. However, this technique requires a complicated, expensive voltage supply device for applying the voltage to the electrode.

SUMMARY OF THE INVENTION

In view of the above-described problems of the conventional STMs, an object of the present invention is to provide a fine adjustment mechanism for an STM which enables the scanning sensitivity to be varied.

To this end, the present invention provides a fine adjustment mechanism for an STM, which comprises a mounting member, a cylindrical piezoelectric element fixed to the mounting member at one end thereof, a probe provided at the other end of the piezoelectric element, and an electrode provided on the inner and outer walls of the piezoelectric element, the electrode being divided into a plurality of electrode groups in the longitudinal direction of the piezoelectric element.

In the present invention, scanning with different sensitivities is achieved by selectively applying a voltage to the plurality of electrode groups divided in the longitudinal direction of the piezoelectric element.

DETAILED DESCRIPTION OF THE PREFERRED EMBODIMENTS

A first embodiment of the present invention will be described below with reference to the accompanying drawings.

Figure 1:
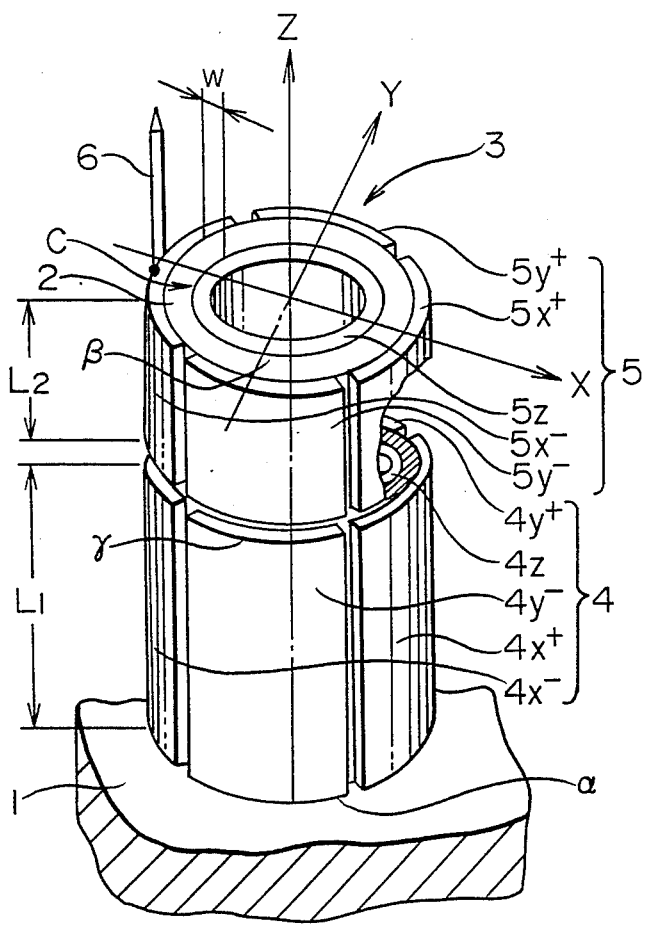
FIG. 1 is a perspective view, with portions broken away for clarity, of a fine adjustment mechanism for an STM, showing a first embodiment of the present invention.

Referring first to FIG. 1 which is a perspective view, with portions broken away for clarity, of a fine adjustment mechanism of an STM according to the present invention, one end α of a piezoelectric element 2 which forms a cylinder C is fixed to a mounting member in the form of a flat plate 1 using, for example, an epoxy resin type adhesive. The inner and outer walls of the piezoelectric element 2 are provided with an electrode means 3. The piezoelectric element 2 is formed of, for example, lead zirconate-titanate (Pb (Zr-Ti)O$_3$), and is polarized such that the electric field exits in a direction of the normal to the side surface of the cylinder C and that the piezoelectric element 2 undergoes distortion in the direction of the central axis (the Z axis). The cylinder C has an inner diameter, an outer diameter, and a wall thickness W which are constant along the overall length of the cylinder C.

The electrode means 3 is divided into a plurality of electrode groups in the longitudinal direction of the cylinder C. Specifically, the electrode means 3 comprises a first electrode group 4 made up of a plurality of electrodes, and a second electrode group 5 including a plurality of electrodes. The first electrode group 4 comprises four electrodes 4x+, 4x−, 4y+, 4y− provided on the outer periphery of the cylinder C in such a manner that they are separated from each other around the periphery of the cylinder, and an electrode 4z formed around the entire inner periphery of the cylinder C, each electrode being made of silver or nickel. In FIG. 1, the electrodes 4x+ and 4x− are located facing each other on the X axis, and the electrodes 4y+ and 4y− are positioned facing each other on the Y axis. Each of the electrodes in the first electrode group 4 has a length $L_1$ in the direction of the Z axis.

The second electrode group 5 comprises four electrodes 5x+, 5x−, 5y+, 5y− provided on the outer periphery of the cylinder C in such a manner that they are separated from each other around the periphery of the cylinder, and an electrode 5z formed around the entire inner periphery of the cylinder C, each electrode being made of silver or nickel. The electrodes 5x+ and 5x− are facing each other on the X axis, and the electrodes 5y+ and 5y− are positioned such that they face each other on the Y axis. Each of the electrodes in the second electrode group 5 has a length $L_2$ in the direction of the Z axis which is not equal to $L_1$.

The first electrode group 4 and the second electrode group 5 are made of the same material and have the same shape, but are different with regard to their respective lengths in the direction of the Z axis. The second electrode group 5 is located at a position to which the first electrode group 4 is moved in parallel in the direction of the central axis (the Z axis) of the cylinder C. Further, the first electrode group 4 and the second electrode group 5 are separated from each other by a very small gap as compared to the lengths $L_1$ and $L_2$ thereof.

A probe 6 is mounted on the other end β of the cylindrical piezoelectric element 2. The probe 6 is fixed to one of the electrodes in the second electrode group 5 or to the outer wall of the cylinder C by an adhesive.

The thus-arranged fine adjustment mechanism is operated in the following two ways (I) and (II) when a voltage is applied to the electrode means 3 thereof.

(I) First, each of the electrodes in the second electrode group 5 is grounded.

In this state, when voltages ±V are applied to the electrode 4z provided on the inner periphery of the cylinder C while the four electrodes 4x+, 4x−, 4y+, and 4y− provided on the outer periphery of the cylinder C are grounded, the piezoelectric element 2 is expanded and contracted in the direction of the Z axis by a displacement $\delta_1$ expressed as follows:

$$\delta_1 = \pm d \times (L_1/W) \times V \quad [1]$$

where d represents the piezoelectric distortion constant of the piezoelectric element 2.

Further, when voltages ±V having opposite polarities are respectively applied to the electrodes 4y+ and 4y− provided on the outer periphery of the cylinder C while the pair of electrodes 4x+ and 4x− provided on the outer periphery of the cylinder C and the electrode 4z provided on the inner periphery of the cylinder C are grounded, the piezoelectric material located between the electrode 4y+ and the electrode 4z and the piezoelectric material located between the electrode 4y− and the electrode 4z are respectively expanded and contracted in the opposite directions along the Z axis, and the cylinder C is thereby curved in the Y - Z plane.

Similarly, when voltages ±V having opposite polarities are respectively applied to the electrodes 4x+ and 4x− while the pair of electrodes 4y+ and 4y− and the electrode 4z are grounded, the cylinder C is curved in the X - Z plane.

(II) Each of the electrodes in the first electrode group 4 is grounded.

In this state, when voltages ±V are applied to the electrode 5z provided on the inner periphery of the cylinder C while the four electrodes 5x+, 5x−, 5y+, and 5y− provided on the outer periphery of the cylinder C are grounded, the piezoelectric element 2 is expanded and contracted in the direction of the Z axis by a displacement $\delta_2$ expressed as follows:

$$\delta_2 = \pm d \times (L_2/W) \times V \quad [2]$$

where d represents the piezoelectric distortion constant of the piezoelectric element 2.

Further, when voltages ±V having opposite polarities are respectively applied to the electrodes 5y+ and 5y− provided on the outer periphery of the cylinder C while the pair of electrodes 5x+ and 5x− provided on the outer periphery of the cylinder C and the electrode 5z provided on the inner periphery of the cylinder C are grounded, the piezoelectric material located between the electrode 5y+ and the electrode 5z and the piezoelectric material located between the electrode 5y− and the electrode 5z are respectively expanded and contracted in the opposite directions along the Z axis, and the cylinder C is thereby curved in the Y - Z plane.

Similarly, when voltages ±V having opposite polarities are respectively applied to the electrodes 5x+ and 5x− while the pair of electrodes 5y+ and 5y− and the electrode 5z are grounded, the cylinder C is curved in the X - Z plane.

Thus, the probe 6 mounted on the other end β of the piezoelectric element 2 can be three-dimensionally moved by selectively applying the voltage to the electrodes in the first electrode group 4 or the second electrode group 5. It is, however, to be noted that the above-described operation (I) differs from the operation (II) in the following points: since the first electrode group 4 and the second electrode group 5 have different lengths $L_1$ and $L_2$, displacement of the cylinder C obtained when the voltages ±V are applied to the first electrode group 4 differs from that provided when the voltages ±V are applied to the second electrode group 5. Further, in the operation (I), the one end α of the piezoelectric element 2 serves as a fixed point, whereas a gap γ formed between the first electrode group 4 and the second electrode group 5 acts as a displaced point while the cylinder C is curved. On the other hand, in the operation (II), the gap γ acts as a fixed point, whereas the other end β of the piezoelectric element 2 serves as a displaced point. Therefore, scanning sensitivity (vertical sensitivity) of the probe 6 in the direction of the Z axis differs in the operations (I) and (II), as does that (horizontal sensitivity) of the probe 6 in the X - Y plane.

Thus, in the first embodiment, scanning sensitivity can be easily changed by selecting to which electrode group the voltage is to be applied, i.e., the first electrode group 4 or the second electrode group 5. This enables the probe to be moved in a way which suits a particular object of observation even when a simple and inexpensive voltage supply device is employed to supply voltages having a constant waveform.

A second embodiment of the present invention will be described below with reference to FIG. 2.

In this embodiment, a straight small tube 7 made of a conductor such as a metal is fixed to one of the electrodes forming the second electrode group 5 or the outer wall of the cylinder C by an adhesive 8. The probe 6 is detachably received by the small tube 7. The probe 6 and the small tube 7 are electrically connected to each other through mechanical contact. Therefore, if the probe 6 is inserted in the small tube 7 with the inserted portion of the probe slightly bent beforehand, reliable electrical connection between the probe 6 and the small tube 7 is ensured by virtue of the elasticity of the probe 6.

This arrangement of the second embodiment facilitates the replacement of a probe 6 having a damaged forward end with a new one.

The materials and dimensions of the components of the fine adjustment mechanism in the second embodiment will now be described in detail.

The piezoelectric element 2 is made of a solid solution of ferroelectric lead titanate ($PbTiO_3$) and antiferroelectric lead zirconate ($PbZrO_3$) which are mixed in an appropriate proportion determined so that the resultant solid solution has a suitable Curie temperature, creep characteristics, hysteresis characteristics, and piezoelectric distortion constant which ensure that the resultant piezoelectric element is stable to variations in the ambient environment and has a voltage sensitivity which produces a suitable mechanical displacement. The dimensions of the piezoelectric element 2 are determined with reference to the piezoelectric distortion constant which ensures that a suitable mechanical displacement is taken into consideration. For example, lead zirconate-titanate ($Pb(Zr-Ti)O_3$) having a piezoelectric distortion constant of $-300 \times 10^{-12}$ m/V and a Curie temperature of about 200° C. may be formed into a cylinder having an inner diameter of 10 mm, an outer diameter of 12 mm, a thickness of 1 mm, and a length of 19 mm.

The electrode 3 may be formed on the surfaces of the cylinder C which constitutes the piezoelectric element 2 to a thickness of about 3 $\mu$m by baking silver or by means of electroless deposition of nickel. The electrodes $4x^+$, $4x^-$, $4y^+$, $4y^-$, and $4z$ forming the first electrode group 4 each have a length $L_1$ of 12 mm in the direction of the Z axis, and the electrodes $5x^+$, $5x^-$, $5y^+$, $5y^-$, and $5z$ forming the second electrode group 5 each have a length $L_2$ of 6 mm in the direction of the Z axis. The gap between each of the electrodes $4x^+$, $4x^-$, $4y^+$, and $4y^-$ in the first electrode group 4 on the outer periphery of the cylinder C, and between each of the electrodes $5x^+$, $5x^-$, $5y^+$, and $5y^-$ in the second electrode group 5 is 1 mm, as is the gap formed between the first electrode group 4 and the second electrode group 5.

One end of a lead wire 9 which is a copper wire having a diameter of 0.2 mm is connected to each of the electrodes in the first and second electrode groups 4 and 5 by solder 10 containing neutral resin. The other end of the lead wire 9 is electrically connected to a voltage supply device (not shown).

The mounting member 1 may be made of Invar (Fe: 64%, Ni: 36%) having a coefficient of thermal expansion of $2 \times 10^{-6}$/°C. or less at a temperature of 30 to 100° C., or Super Invar (Fe: 63%, Ni: 32%, Co: 5%)) having a coefficient of thermal expansion of $1.3 \times 10^{-6}$/°C. or less at a temperature of 30 to 100° C.

The adhesive 8 which contains a thixotropic epoxy resin for preventing drooping and an aromatic amine type curing agent may be used to fix the piezoelectric element 2 to the mounting member 1 or to fix the small tube 7 to one of the electrodes forming the second electrode group 5 or to the outer wall of the cylinder C.

One end of a tunnel current measuring conductor 11 made of an annealed copper wire having a diameter of 0.5 mm is connected to the outer periphery of the small tube 7 by the solder 10 containing neutral resin. The other end of the tunnel current measuring conductor 11 is electrically connected to a tunnel current measuring device (not shown).

The probe 6 may be a wire having a diameter of 0.25 mm and made of tungsten (W) or platinum-iridium alloy (Pt 90%-Ir 10%), its forward end being sharpened by machining or electrolytic polishing.

The operation of the second embodiment will be described below.

(III) The first electrode group 4 alone is driven.

Each of the electrodes in the second electrode group 5 is grounded. In this state, when voltages $\pm V$ are applied to the electrode $4z$ provided on the inner periphery of the cylinder C while the four electrodes $4x^+$, $4x^-$, $4y^+$, and $4y^-$ provided on the outer periphery of the cylinder C are grounded, the piezoelectric element 2 is expanded and contracted, as seen from Equation [1], in the direction of the Z axis by a voltage sensitivity of 3.6 nm/V.

Further, when voltages $\pm V$ having opposite polarities are respectively applied to the electrodes $4y^+$ and $4y^-$ provided on the outer periphery of the cylinder C while the pair of electrodes $4x^+$ and $4x^-$ provided on the outer periphery of the cylinder C and the electrode $4z$ provided on the inner periphery of the cylinder C are grounded, the piezoelectric material located between the electrode $4y^+$ and the electrode $4z$ and the piezoelectric material located between the electrode $4y^-$ and the electrode $4z$ are respectively expanded and contracted in the opposite directions along the Z axis by a voltage sensitivity of 3.6 nm/V, and the cylinder C is thereby curved in the Y - Z plane with the one end $\alpha$ thereof and the gap $\gamma$ between the first electrode group 4 and the second electrode group 5 respectively serving as a fixed point and a displaced point.

Similarly, when voltages $\pm V$ having opposite polarities are respectively applied to the electrodes $4x^+$ and $4x^-$ while the pair of electrodes $4y^+$ and $4y^-$ and the electrode $4z$ are grounded, the cylinder C is curved in the X - Z plane.

(IV) The second electrode group 5 alone is driven.

Each of the electrodes in the first electrode group 4 is grounded. In this state, when voltages $\pm V$ are applied to the electrode $5z$ provided on the inner periphery of the cylinder C while the four electrodes $5x^+$, $5x^-$, $5y^+$, and $5y^-$ provided on the outer periphery of the cylinder C are grounded, the piezoelectric element 2 is expanded and contracted in the direction of the Z axis by a voltage sensitivity of 1.8 nm/V, as seen from Equation [2].

Further, when voltages $\pm V$ having opposite polarities are respectively applied to the electrodes $5y^+$ and $5y^-$ provided on the outer periphery of the cylinder C while the pair of electrodes $5x^+$ and $5x^-$ provided on the outer periphery of the cylinder C and the electrode $5z$ provided on the inner periphery of the cylinder C are grounded, the piezoelectric material located between the electrode 5y+ and the electrode 5z and the piezoelectric material located between the electrode 5y− and the electrode 5z are respectively expanded and contracted in the opposite directions along the Z axis by a voltage sensitivity of 1.8 nm/V, and the cylinder C is thereby curved in the Y - Z plane with the gap γ formed between the first electrode group 4 and the second electrode group 5 and the other end β of the cylinder C respectively acting as a fixed point and a displaced point.

Similarly, when voltages ±V having opposite polarities are respectively applied to the electrodes 5x+ and 5x− while the pair of electrodes 5y+ and 5y− and the electrode 5z are grounded, the cylinder C is curved in the X - Z plane.

Thus, when the second electrode group 5 is driven, the piezoelectric element 2 is expanded and contracted or curved in a similar manner to that in which it is expanded and contracted when the first electrode group 4 is driven. However, the voltage sensitivity obtained when the second electrode group 5 is driven is one half of that provided when the first electrode group 4 is driven.

(V) Both the first and second electrode groups are driven at the same time.

The electrodes in the first and the second electrode groups are driven in the same manner as in the operations (III) or (IV) in a state where the corresponding electrodes in the first electrode group 4 and the second electrode group 5, e.g., the electrodes 4x+ and 5x+ and the electrode 4z and 5z, have the same potentials. This means that both the operations (III) and (IV) are conducted concurrently. Therefore, the piezoelectric element 2 is expanded and contracted or curved with a voltage sensitivity of 5.4 nm/V with the end α serving as a fixed end and the other end β acting as a displaced point.

Thus, three variations of scanning sensitivity of the piezoelectric element 2 are available, which are achieved by selecting one of the above-described three driving methods, namely, driving of the first electrode group 4 alone, driving of the second electrode group 5 alone, and driving of both the first and second electrode groups 4 and 5. These choices permit observation with three different scanning sensivities with the fine adjustment mechanism even if a simple and inexpensive voltage supply device which supplies voltages having a constant waveform is employed.

The second embodiment involves observation with three types of scanning sensitivity which are provided by dividing the electrode means 3 into the first electrode group 4 and the second electrode group 5. However, if the electrode means 3 is divided into three electrode groups or more having a different length in the longitudinal direction of the piezoelectric element 2, a fine adjustment mechanism which has available a great number of types of scanning sensitivity can be provided.

Figure 3:
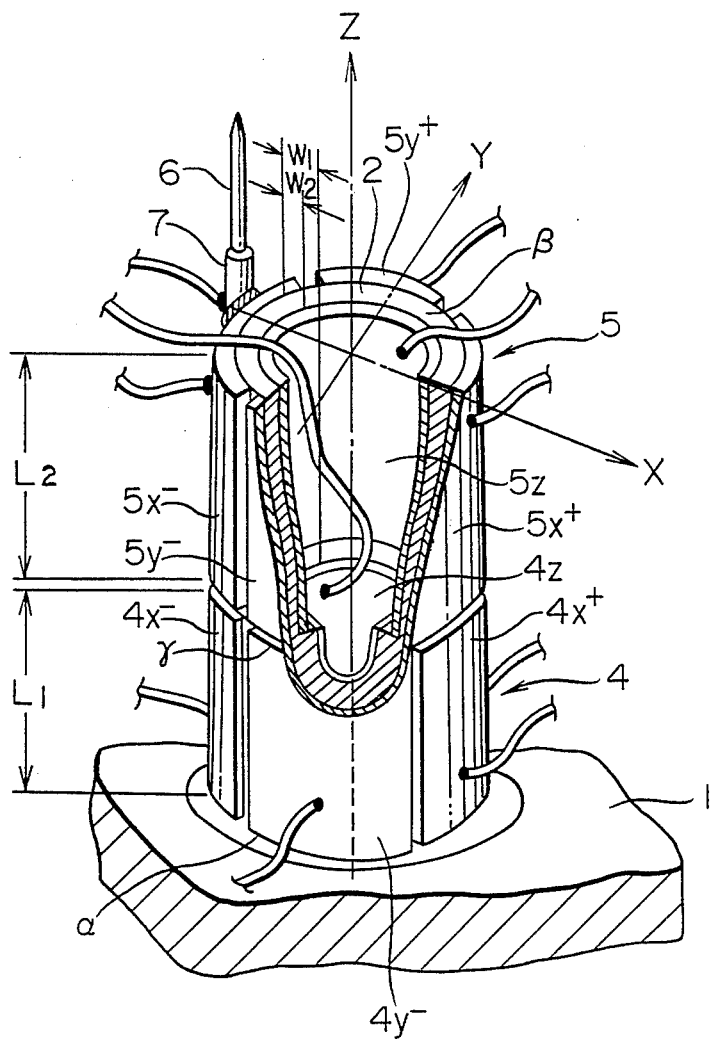
FIG. 3 is a perspective view, with portions broken away for clarity, of a fine adjustment mechanism for an STM, showing a third embodiment of the present invention.

A third embodiment of the present invention will be described below with reference to FIG. 3.

In the third embodiment, the thickness of the piezoelectric element 2 is not even in the overall length thereof, i.e., in the direction of the Z axis, but the thickness of the one end α thereof is different from that at the other end β. The piezoelectric element 2 may be a piezoelectric material having a piezoelectric distortion constant d of $-300 \times 10^{-12}$ m/V which is formed into a cylinder C having an outer diameter 12 mm and a length of 19 mm. The piezoelectric element 2 has a thickness $W_1$ of 2 mm over the length of 9 mm from the one end α thereof, as well as a thickness $W_2$ of 1 mm over the length of 9 mm from the other end β thereof, the thicknesses being changed over the length of 1 mm at the intermediate portion γ of the cylinder C.

Figure 2:
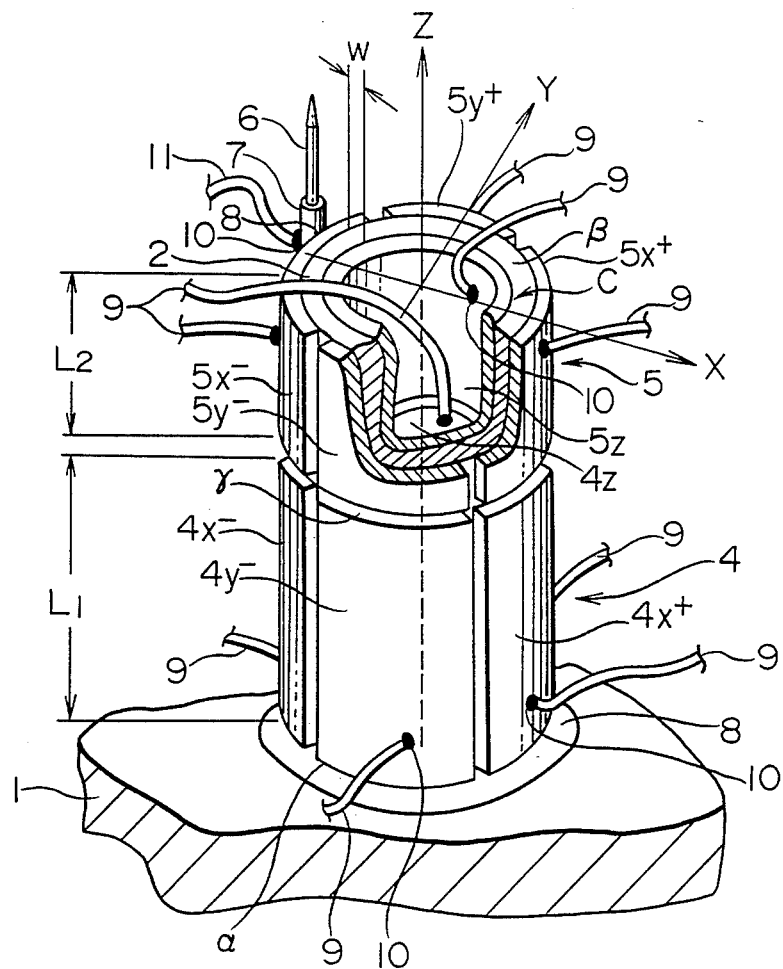
FIG. 2 is a perspective view, with portions broken away for clarity, of a fine adjustment mechanism for an STM, showing a second embodiment of the present invention.

The inner and outer peripheries of the thus-arranged piezoelectric element 2 are provided with the first electrode group 4 and the second electrode group 5 which are divided in the longitudinal direction of the piezoelectric element 2, as those in the first and second embodiments shown in FIGS. 1 and 2. However, each of the electrodes in the first electrode group 4 and in the second electrode group 5 have a length of 9 mm in the direction of the Z axis. More specifically the first electrode group 4 is formed on the inner and outer peripheries of a thick portion of the piezoelectric element 2 which has a thickness $W_1$ of 2 mm, while the second electrode group 5 is formed on the inner and outer peripheries of a thin portion which has a thickness $W_2$ of 1 mm.

The first electrode group 4 comprises the 4x+, 4x−, 4y+, and 4y− provided on the outer periphery of the cylinder C and divided around the periphery thereof and the electrode 4z provided around the entire inner periphery of the cylinder C, while the second electrode group 5 comprises the electrodes 5x+, 5x−, 5y+, and 5y− provided on the outer periphery of the cylinder C and divided around the periphery thereof and the electrode 5z provided around the entire inner periphery of the cylinder C. Further, the interval between the four electrodes 4x+, 4x−, 4y+, and 4y− in the first electrode group 4 divided around the outer periphery of the cylinder C and between the four electrodes 5x+, 5x−, 5y+, and 5y− in the second electrode group 5 divided around the outer periphery of the cylinder C is 1 mm, as is the gap between the first and second electrode group 4 and 5.

In this embodiment, the piezoelectric element 2 is expanded and contracted or curved using a voltage sensitivity of 1.35 nm/V (W=$W_1$, $L_1$=$L_2$) from equation [1] and 2.7 nm/V (W=$W_2$, $L_2$=$L_1$) from Equation [2] when the first electrode group 4 and second electrode group 5 are individually driven. When both of the first and second electrode groups 4 and 5 are driven, the piezoelectric element 2 is expanded and contracted or is curved by a voltage of sensitivity of 4.05 nm/V.

Thus, a fine adjustment mechanism which can be operated with any of three scanning sensitivities is provided by changing the thickness of the piezoelectric element in the direction of the Z axis in two stages.

In the third embodiment, since the portion of the piezoelectric element 2 which is located at the side of the one end α and at which the piezoelectric element 2 is fixed to the mounting member 1 is made thick, the piezoelectric element 2 is connected to the mounting member 1 more firmly.

It is to be noted that a fine adjustment mechanism which has the same effect can be provided even if the thickness of the portion of the piezoelectric element 2 on which the first electrode group is formed is made different from that of the portion on which the second electrode group is provided and the length of the first electrode group 4 is made different from that of the second electrode group 5.

Additionally, a fine adjustment mechanism that can be operated by any of more than three types of scanning sensitivity can be provided if the thickness of the portions of the piezoelectric element 2 are varied in the direction of the Z axis in three stages or more and an electrode is formed on each of these portions.

What is claimed is:

1. A fine adjustment mechanism for a scanning tunneling microscope comprising:
   a mounting member;
   a cylindrical piezoelectric element having opposed first and second ends and opposed inner and outer walls, said element extending in a longitudinal direction between said ends and being fixed to said mounting member at said first end;
   a probe disposed at the second end of said piezoelectric element;
   an inner electrode disposed on the inner wall of said piezoelectric element; and
   a plurality of outer electrodes disposed on the outer wall of said piezoelectric element, said outer electrodes being sectioned into a plurality of groups transverse to the longitudinal direction of said piezoelectric element.

2. The fine adjustment mechanism according to claim 1 wherein each of said groups of outer electrodes comprises four electrodes circumferentially spaced from one another along the outer wall of said piezoelectric element and said inner electrode comprises a ring-shaped electrode disposed around the entire inner wall of said piezoelectric element.

3. The fine adjustment mechanism according to claim 1 wherein at least two of said groups of outer electrodes have different lengths in the longitudinal direction of said piezoelectric element.

4. The fine adjustment mechanism according to claim 1 wherein the thickness of said piezoelectric element between said inner electrode and said outer electrodes is different for at least two of said groups of electrodes.

5. The fine adjustment mechanism according to claim 4 wherein each of said groups of outer electrodes has the same length in the longitudinal direction of said piezoelectric element.

6. The fine adjustment mechanism according to claim 4 wherein at least two of said groups of outer electrodes have different lengths in the longitudinal direction of said piezoelectric element.

7. The fine adjustment mechanism according to claim 4 wherein the first end of said piezoelectric element has the largest thickness.

8. The fine adjustment mechanism according to claim 1 comprising a tube disposed at the second end of said piezoelectric element, said probe being inserted into said tube.

9. The fine adjustment mechanism according to claim 8 wherein said tube is metal.

10. A fine adjustment mechanism for a scanning tunneling microscope comprising:
    a cylindrical piezoelectric element having opposed first and second ends and opposed inner and outer walls, said element extending along its length in a longitudinal direction between said ends;
    a probe disposed at one of said ends of said piezoelectric element;
    an inner electrode disposed on the inner wall of said piezoelectric element; and
    a plurality of outer electrodes disposed on the outer wall of said piezoelectric element,
    wherein said adjustment mechanism is divided along its length into a plurality of sections, at least two of which have a different scanning sensitivity.

11. The adjustment mechanism according to claim 10 wherein said outer electrodes are divided along the length of the piezoelectric element into a plurality of groups, each of said groups being disposed in a different one of said sections.

12. The adjustment mechanism according to claim 11 wherein at least two of said groups of outer electrodes have different lengths.

13. The adjustment mechanism according to claim 10 wherein the thickness of said piezoelectric element is different in at least two of said sections.

14. The adjustment mechanism according to claim 10 comprising a mounting member to which the first end of said piezoelectric element is secured, the section of said adjustment mechanism which is closest to said mounting member having the highest scanning sensitivity.

* * * * *